(12) United States Patent
Kim

(10) Patent No.: US 6,717,884 B2
(45) Date of Patent: Apr. 6, 2004

(54) SYNCHRONOUS MEMORY DEVICE WITH REDUCED ADDRESS PINS

(75) Inventor: Kwan-Weon Kim, Ichon (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/198,926

(22) Filed: Jul. 22, 2002

(65) Prior Publication Data

US 2003/0123319 A1 Jul. 3, 2003

(30) Foreign Application Priority Data

Dec. 29, 2001 (KR) .................................. 10-2001-87715

(51) Int. Cl.$^7$ ................................................. G11C 8/00
(52) U.S. Cl. ................... 365/233; 265/189.05; 265/194
(58) Field of Search ............................ 365/233, 189.05, 365/194

(56) References Cited

U.S. PATENT DOCUMENTS

| | | | |
|---|---|---|---|
| 5,835,448 A | * 11/1998 | Ohtani et al. ............... | 365/233 |
| 6,011,751 A | 1/2000 | Hirabayashi | |
| 6,044,032 A | 3/2000 | Li | |
| 6,061,292 A | 5/2000 | Su et al. | |
| 6,081,477 A | 6/2000 | Li | |
| 6,094,375 A | 7/2000 | Lee | |
| 6,118,792 A | 9/2000 | Beshai | |
| 6,125,078 A | 9/2000 | Ooishi et al. | |
| 6,130,853 A | 10/2000 | Wang et al. | |
| 6,147,296 A | 11/2000 | Freundlich | |
| 6,154,393 A | 11/2000 | Otsuka et al. | |
| 6,154,418 A | 11/2000 | Li | |
| 6,154,419 A | 11/2000 | Shakkarwar | |
| 6,178,139 B1 | 1/2001 | Hirobe et al. | |
| 6,272,053 B1 | * 8/2001 | Choi ..................... | 365/189.03 |

FOREIGN PATENT DOCUMENTS

| | | |
|---|---|---|
| JP | 11-203863 | 7/1999 |
| JP | 11-213668 | 8/1999 |

* cited by examiner

*Primary Examiner*—Huan Hoang
(74) *Attorney, Agent, or Firm*—Jacobson Holman PLLC

(57) ABSTRACT

A synchronous memory device is capable of reducing the number of address pins by changing address input. The synchronous memory device includes at least one common pin receiving a first signal and a second signal, latch circuits coupled to the common pin, wherein the latch circuit latches the first and second signals and one of the latch circuits selectively outputs the first or second signal in response to first or second internal clock pulses, and a clock pulse generator for receiving an external clock signal and for producing the first and second internal clock pulses from the external clock signal.

10 Claims, 4 Drawing Sheets

SYNCHRONOUS MEMORY DEVICE WITH REDUCED ADDRESS PINS

FIELD OF THE INVENTION

The present invention relates to a semiconductor memory device and, more particularly, to a synchronous memory device capable of reducing the number of address pins by changing address input.

DESCRIPTION OF THE RELATED ARTS

Recently, synchronous semiconductor memory devices, such as double data rate (DDR) SDRAMs and Rambus DRAMs, have been proposed as next generation memory devices because these synchronous semiconductor memory devices implement higher speed operation than asynchronous semiconductor memory devices.

Typically, a central processing unit (CPU) combines control signals in order for the memory to recognize a command. For example, when a command, such as a chip selection signal or a write enable signal, is enabled, the memory recognizes this command as a control signal for a write operation. Control signals transmitted from the CPU include chip selection signal, write enable signal, column address strobe signal, row address strobe signal and clock enable signal. These control signals are called "command signals" because a command is created by a combination of these control signals. Accordingly, pins required to apply these control signals to the memory are called "command pins."

As mentioned above, the memory chip has a plurality of command pins and even more address pins for specifying a memory cell in which the command is executed.

FIG. 1 is a schematic diagram of command and address pins of a conventional synchronous memory device.

The conventional synchronous memory device in FIG. 1 has fourteen address pins A0 to A13, five command pins CS, RAS, CAS, WE and CKE and two clock pins CLK and CLKz. Input signals are buffered in input buffers 10 wherein the input buffers 10 are coupled to the pins on one side and to latch circuits 16 on the other.

Each latch circuit 16 latches address or command signal in response to an internal clock signal clkp2 from a clock pulse generator 14. That is, the latch circuits 16 coupled to the address pins A0 to A13 output the buffered address signals <at0:at13> in response to the internal clock signal clkp2 and the latch circuits 16 coupled to the command pins CS, RAS, CAS, WE and CKE output the buffered command signals cs2, cs2z, ras2, ras2z, cas2, cas2z, we2, we2z, cke2 and cke2z in response to the internal clock signal clkp2.

On the other hand, the internal clock signal clkp2, which is used for controlling the latch circuits 16, is generated by the clock pulse generator 14. The clock pulse generator 14 receives an internal clock signal iclk from a clock buffer 12 which receives the external clock signals.

In the synchronous memory device mentioned above, the latched address and command signals are outputted at a falling edge of the internal clock signal iclk. The command signals are inputted into the memory via the command pins and the address signals are inputted into the memory via the address pins. Accordingly, to receive the address and command signals simultaneously, pins for the address and command signals are independently provided.

Meanwhile, the integration of the memory continuously increases and this denotes an increase in the number of memory cells. As a result, much more address bits are required to select one among many cells.

Notwithstanding the diminishment of the design rule based on the improved semiconductor memory processes, the package technology does not act up to such a development in integration. Accordingly, the number of pins in memory devices inevitably increases, thereby increasing the chip size.

SUMMARY OF THE INVENTION

It is, therefore, an object of the present invention to provide a synchronous memory device capable of reducing the number of address pins by changing address input.

It is another object of the present invention to provide a synchronous memory device which reduces power consumption by reducing the number of input buffers.

In accordance with an aspect of the present invention, there is a synchronous memory device receiving various signals from an external controller, including at least one common pin receiving a first signal and a second signal; latch circuits coupled to the common pin, wherein the latch circuits latch the first and second signals and one of the latch circuits selectively outputs the first or second signal in response to first and second internal clock pulses; and clock pulse generating means for receiving the external clock signal and for producing the first and second internal clock pulses using the external clock signal.

In accordance with yet another aspect of the present invention, there is a synchronous memory device receiving various signals from an external controller, including: a plurality of address pins for receiving address signals; a plurality of address/command common pins, each of which receiving an address signal and a command signal; a plurality of input buffers, each coupled to a corresponding address pin or a corresponding address/command common pin for buffering an address or a command signal; a plurality of first latch circuits coupled to the buffers respectively, wherein each of the first latch circuits latches the address signal and outputs the address signal in response to a first internal clock pulse; a plurality of second latch circuits coupled to the buffers, respectively, wherein each of the second latch circuits latches the command signal and outputs the command signal in response to a second internal clock pulse; and a clock pulse generating means for receiving the external clock signal and for producing the first and second internal clock pulses from the external clock signal.

BRIEF DESCRIPTION OF THE DRAWINGS

Other objects and aspects of the present invention will become apparent from the following description of the preferred embodiments with reference to the accompanying drawings, in which.

DETAILED DESCRIPTION OF THE INVENTION

Hereinafter, the present invention will be described in detail with reference to the accompanying drawings.

Figure 1:
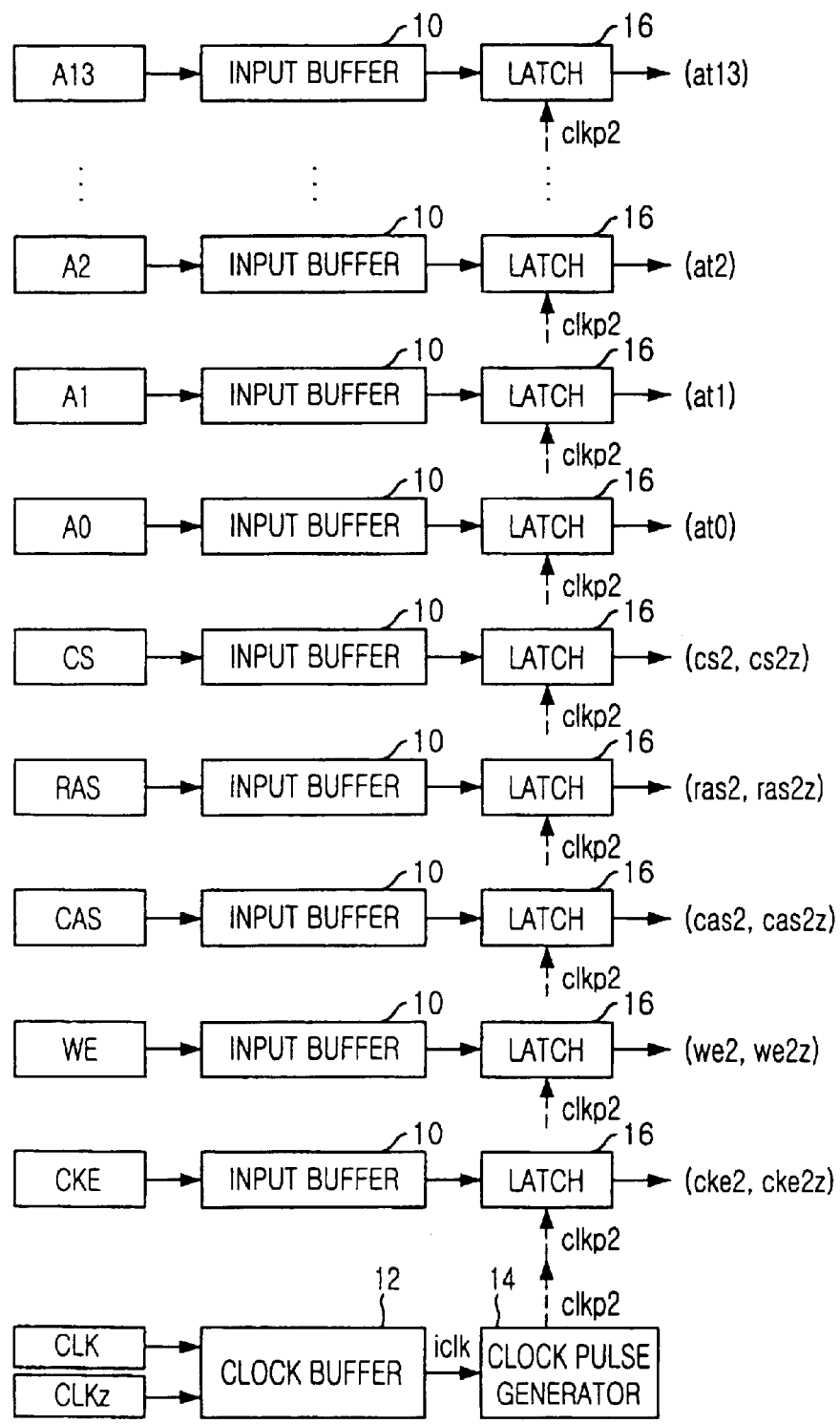
FIG. 1 is a block diagram illustrating command/address pins of a conventional synchronous memory device.
Figure 2:
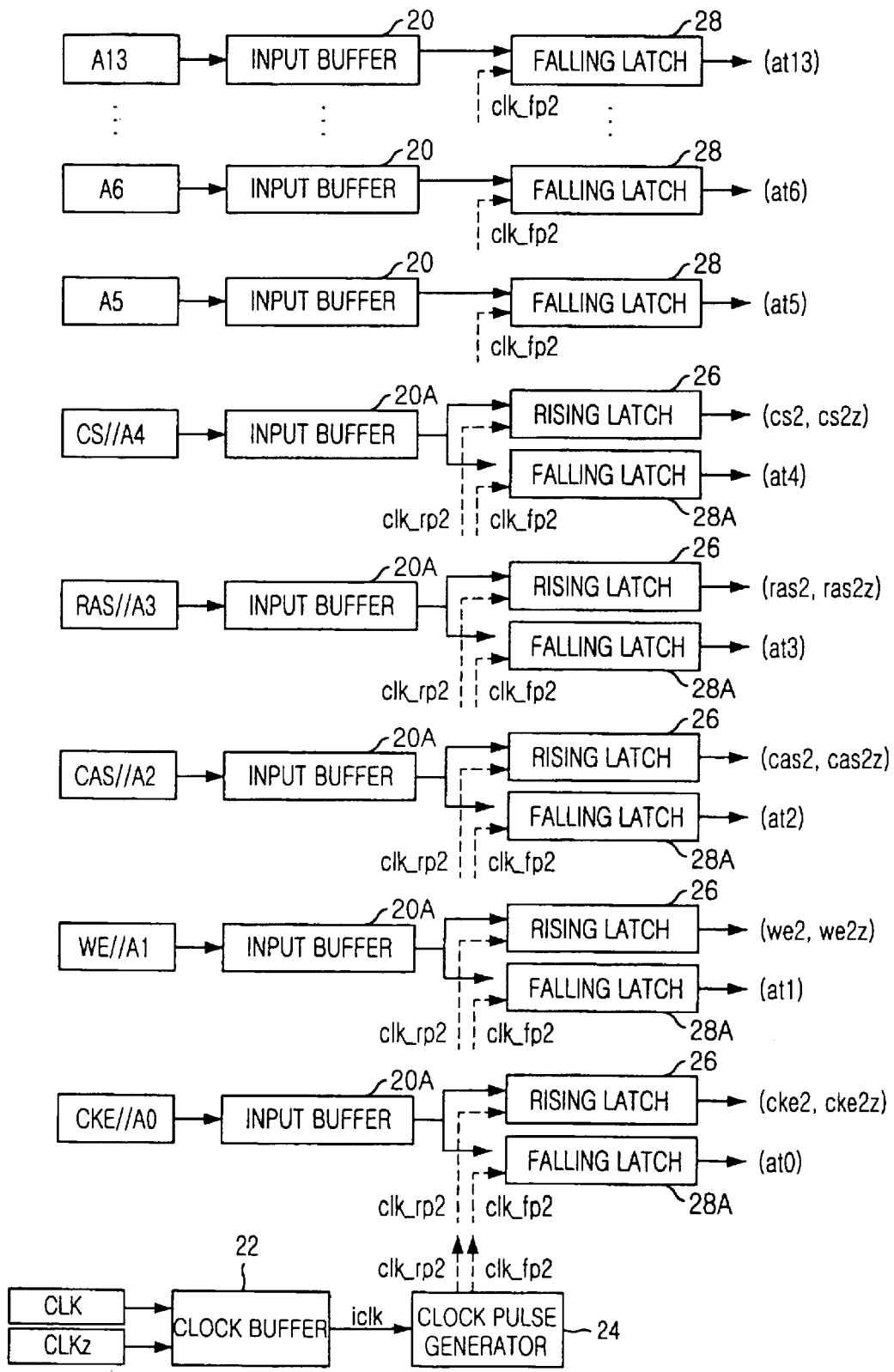
FIG. 2 is a block diagram illustrating command/address pins of a synchronous memory device in accordance with the present invention.

Referring to FIG. 2, a synchronous memory device according to the present invention has fourteen address pins A0 to A13, five command/address pins CS/A4, RAS/A3, CAS/A2, WE/A1 and CKE/A0 and two clock pins CLK and CLKz. Unlike the conventional synchronous memory device in FIG. 1, the address signals share five pins with the command signals. The address pins A5 to A13 and the command/address pins CS/A4, RAS/A3, CAS/A2, WE/A1 and CKE/A0 are connected to input buffers 20 and 20A, respectively, and the clock pins CLK and CLKz are connected to a clock buffer 22.

The input buffers 20 receiving the address signals A5 to A13 are respectively connected to falling latch circuits 28, which are synchronized with a falling clock signal clk_fp2 generated in a clock pulse generator 24. The falling clock signal clk_fp2 is a clock signal which is produced in synchronization with a falling edge of an external clock signal applied to the clock pins CLK and CLKz and a rising clock signal clk_rp2 is a clock signal which is produced in synchronization with a rising edge of the external clock signal. Further, each input buffer 20A receiving the address and command signals through one of the command/address pins CS/A4, RAS/A3, CAS/A2, WE/A1 or CKE/A0 is connected to a rising latch circuit 26 synchronized with the rising clock signal clk_rp2 and a falling latch circuit 28A synchronized with the falling clock signal clk_fp2. Both rising and falling clock signals clk_rp2 and clk_fp2 are generated in the clock pulse generator 24.

The rising latch circuits 26 latch only the command signals in synchronization with the rising clock signal clk_rp2 and the falling latch circuits 28 latch only the address signals in synchronization with the falling clock signal clk_fp2. In other words, the address signals A0 to A4, which are latched in the falling latch circuit 28A, are outputted in response to the falling clock signal clk_fp2 and the command signals CS/A4, RAS/A3, CAS/A2, WE/A1, which are latched in the rising latch circuit 26, are outputted in response to the rising clock signal clk_rp2.

Figure 3:
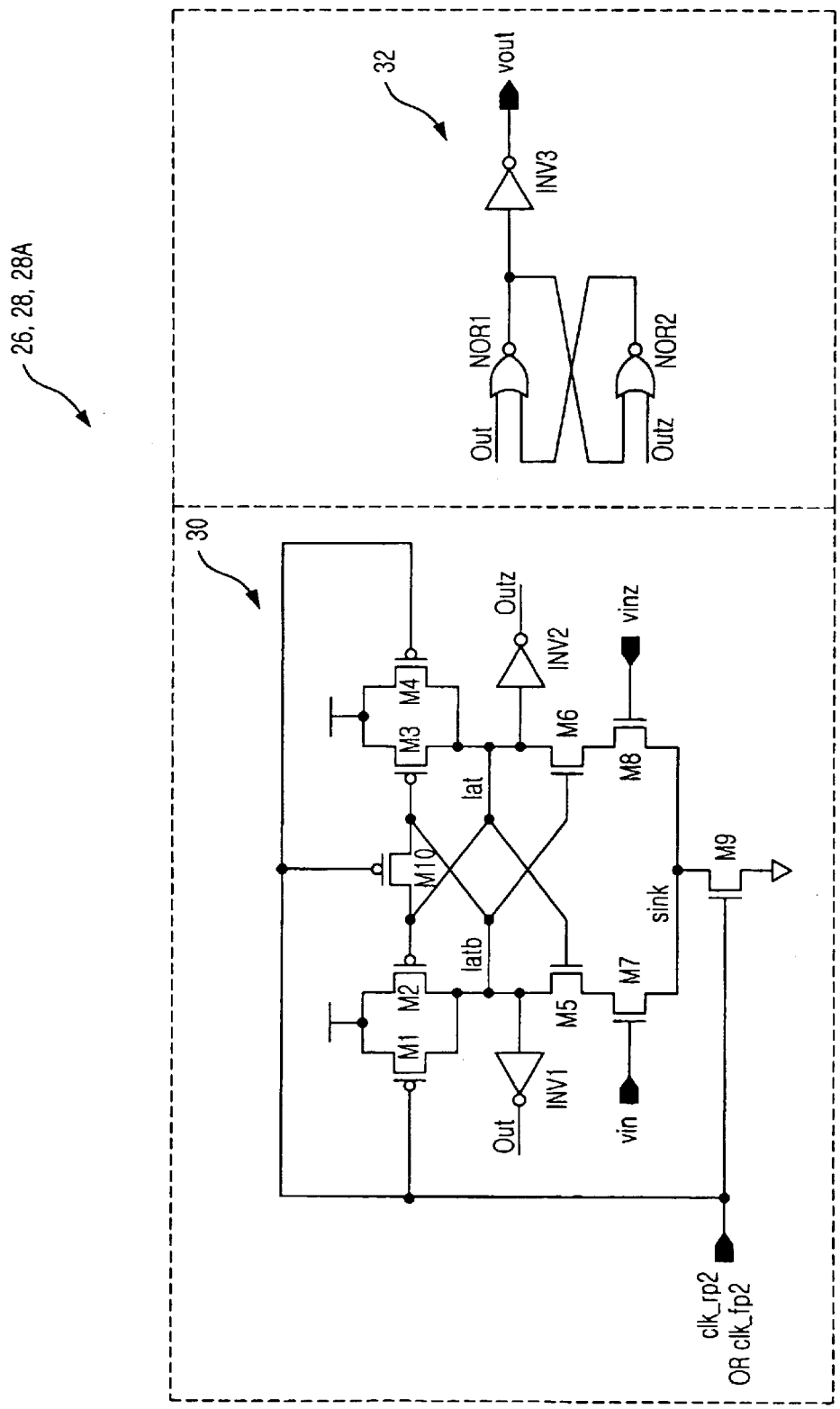
FIG. 3 is a latch circuit shown in FIG. 2.

Referring to FIG. 3, each latch circuit 26, 28 and 28A in FIG. 2 has a latch 30 and a driver 32 and is enabled by the falling and rising clock signals clk_fp2 and clk_rp2. The latch 30 is a cross-type latch which is well-known to those skilled in the art to which the subject matter pertains and it except that it is enabled by the falling and rising clock signals clk_fp2 and clk_rp2.

To provide a current path, transistors M1, M4, M9 and M10 are turned on in response to the falling and rising clock signals clk_fp2 and clk_rp2. Transistors M7 and M8 are turned on in response to input signals Vin and Vinz from the input buffer 20 or 20A. Transistors M2, M3, M5 and M6 are cross-coupled to each other and are connected to two output terminals of the latch 30. Inverters INV1 and INV2, which are coupled to the output terminals of the latch 30, output first and second output signals Out and Outz, respectively. Detailed description of the latch 30 will be omitted because its configuration is based on the cross type latch circuit.

On the other hand, the driver 32 includes two NOR gates NOR1 and NOR2, which respectively receives the first and second output signals Out and Outz, and an inverter INV3 to invert an output signal of the first NOR gate NOR1.

Figure 4:
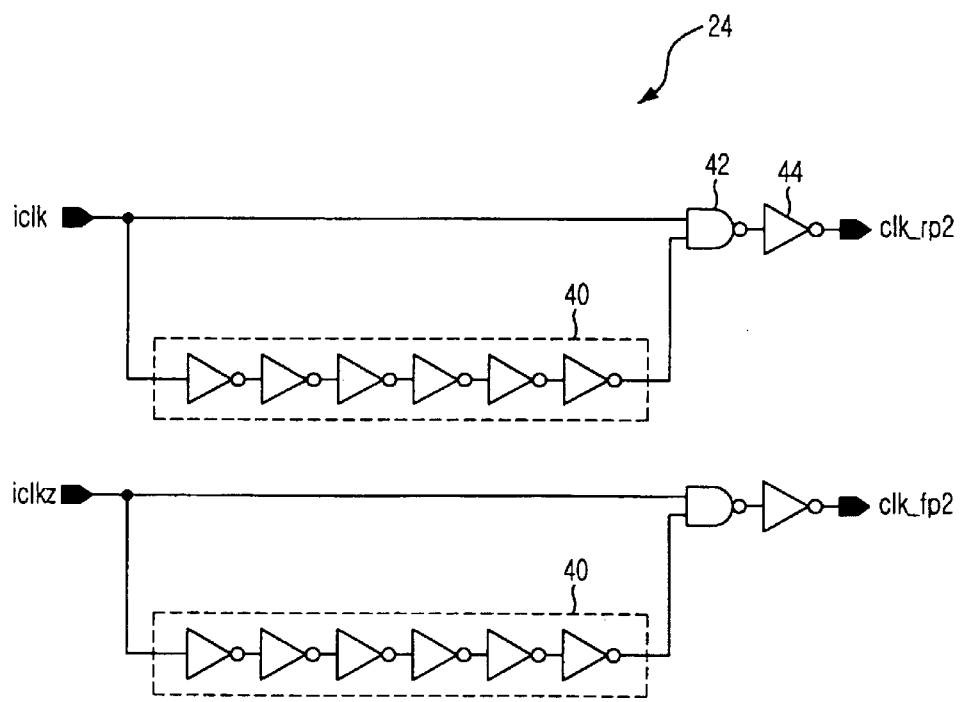
FIG. 4 is a clock pulse generator shown in FIG. 2.

Referring to FIG. 4, the clock pulse generator 24 includes a NAND gate 42 and a delay unit 40. The NAND gate 42 receives a buffered clock signal iclk or iclkz from the clock buffer 22 and a delayed clock signal from the delay unit 40, thereby forming an output clock signal with a narrow pulse width. An inverter 44 inverts the output signal of the NAND gate 42 in order to produce stabilized pulse signals for the falling and rising clock signals clk_fp2 and clk_rp2.

Figure 5:
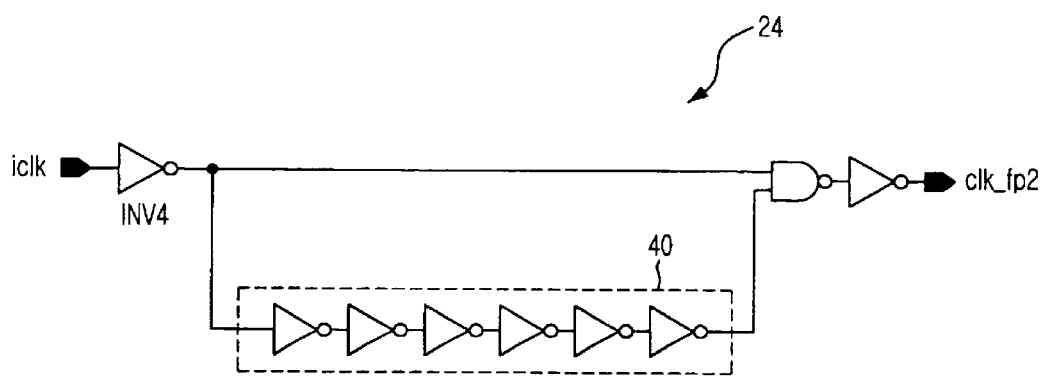
FIG. 5 is another embodiment of the clock pulse generator shown in FIG. 2.

Referring to FIG. 5, which is another embodiment for the clock generator 24, the buffered clock signal iclkz for producing the falling clock signal clk_fp2 can be also obtained via an inverter INV4. Although the additional inverter INV4 causes the input clock signal to delay time, this does not pose a problem because delay time across one gate does not influence the memory operation.

As apparent from above, the command signals via the command pins are processed in response to the rising clock signal. Furthermore, the address signals, which are inputted into the command pins, are processed in response to the falling clock signal. As a result, the command pins are shared with the address pins reducing the total number of pins. This reduction in the number of input pins also reduces the number of input buffers thereby reducing the amount of standby current consumed by the input buffers. Since extra address pins can be used to input other command signals with restriction on the number of pins, various commands may be implemented with the reduction in memory package size.

Although the preferred embodiments of the present invention have been disclosed for illustrative purposes, those skilled in the art will appreciate that various modifications, additions and substitutions are possible, without departing from the scope and spirit of the present invention as described in the accompanying claims.

What is claimed is:

1. A synchronous memory device receiving various signals from an external controller, comprising:
    at least one common pin receiving a first signal and a second signal;
    latch circuits coupled to the common pin, wherein the latch circuits latch the first and second signals and selectively output the first or and second signals in response to a rising edge and a falling edge of an internal clock, respectively; and
    clock pulse generating means for receiving an external clock signal and for producing the internal clock using the external clock signal.

2. The synchronous memory device as recited in claim 1, wherein the first signal is an address signal and the second signal is a command signal.

3. The synchronous memory device as recited in claim 1, wherein the clock pulse generating means produces the falling and rising edges of the internal clock in synchronization with falling and rising edges of the external clock signal.

4. The synchronous memory device as recited in claim 1, wherein the clock pulse generating means includes:
    a first delay unit to delay the external clock signal;
    first logic means for performing a NAND operation on the external clock signal and the delayed external clock signal generated from the first delay unit;
    a second delay unit to delay an inverted external clock signal; and
    second logic means for performing a NAND operation on the inverted external clock signal and the delayed inverted external clock signal generated from the second delay unit.

5. A synchronous memory device receiving various signal signals from an external controller, comprising:
    a plurality of address pins for receiving address signals;
    a plurality of address/command common pins, each of which receiving an address signal and a command signal;

a plurality of input buffers, each coupled to a corresponding address pin or a corresponding address/command common pin for buffering an address or a command signal;

a plurality of first latch circuits coupled to the buffers respectively, wherein each of the first latch circuits latches the address signal and outputs the address signal in response to a first internal clock pulse;

a plurality of second latch circuits coupled to the buffers respectively, wherein each of the second latch circuits latches the command signal and outputs the command signal in response to a second internal clock pulse; and clock pulse generating means for receiving an external clock signal and for producing the first and second internal clock pulses from the external clock signal.

6. The synchronous memory device as recited in claim 5, wherein the clock pulse generating means produces the first and second internal clock pulses in synchronization with falling and rising edges of the external clock signal.

7. The synchronous memory device as recited in claim 6, wherein the clock pulse generating means includes:

a first delay unit to delay the external clock signal;

first logic means for performing a NAND operation on the external clock signal and the delayed external clock signal generated from the first delay unit;

a second delay unit to delay an inverted external clock signal; and second logic means for performing a NAND operation on the inverted external clock signal and the delayed inverted external clock signal generated from the second delay unit.

8. A synchronous memory device receiving various signals from an external controller, comprising:

at least one common pin receiving a first signal and a second signal;

latch circuits coupled to the common pin, wherein the latch circuits latch the first and second signals and one of the latch circuits selectively outputs the first or second signal in response to first and second internal clock pulses; and clock pulse generating means for receiving an external clock signal and for producing the first and second internal clock pulses from the external clock signal, said clock pulse generating means including, a first delay unit to delay the external clock signal;

first logic means for performing a NAND operation on the external clock signal and the delayed external clock signal generated from the first delay unit;

a second delay unit to delay an inverted external clock signal; and second logic means for performing a NAND operation on the inverted external clock signal and the delayed inverted external clock signal generated from the second delay unit.

9. The synchronous memory device as recited in claim 8, wherein the first signal is an address signal and the second signal is a command signal.

10. The synchronous memory device as recited in claim 8, wherein the clock pulse generating means produces the first and second internal clock pulses in synchronization with falling and rising edges of the external clock signal.

* * * * *